US012660602B2

(12) United States Patent
Nguyen et al.

(10) Patent No.: US 12,660,602 B2
(45) Date of Patent: Jun. 16, 2026

(54) METAL INTERCONNECT LAYERS FOR FET ARCHITECTURES

(71) Applicant: International Business Machines Corporation, Armonk, NY (US)

(72) Inventors: Son Nguyen, Schenectady, NY (US); Ruilong Xie, Niskayuna, NY (US); Kisik Choi, Watervliet, NY (US); Hosadurga Shobha, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 440 days.

(21) Appl. No.: 18/206,060

(22) Filed: Jun. 5, 2023

(65) Prior Publication Data

US 2024/0404949 A1      Dec. 5, 2024

(51) Int. Cl.
| | |
|---|---|
| *H01L 23/528* | (2006.01) |
| *H01L 21/768* | (2006.01) |
| *H01L 23/48* | (2006.01) |
| *H01L 23/532* | (2006.01) |
| *H01L 27/088* | (2006.01) |
| *H01L 29/06* | (2006.01) |
| *H01L 29/423* | (2006.01) |
| *H01L 29/775* | (2006.01) |
| *H10D 30/43* | (2025.01) |
| *H10D 30/67* | (2025.01) |
| *H10D 62/10* | (2025.01) |
| *H10D 84/83* | (2025.01) |
| *H10W 20/00* | (2026.01) |
| *H10W 20/20* | (2026.01) |

(Continued)

(52) U.S. Cl.
CPC .......... *H10W 20/427* (2026.01); *H10D 30/43* (2025.01); *H10D 30/6735* (2025.01); *H10D 62/121* (2025.01); *H10D 84/83* (2025.01); *H10W 20/01* (2026.01); *H10W 20/20* (2026.01); *H10W 20/48* (2026.01)

(58) Field of Classification Search
CPC . H01L 23/5286; H01L 21/768; H01L 23/481; H01L 23/5329; H10D 30/43; H10D 30/6735; H10D 62/121; H10D 84/83
USPC ........................................ 257/401
See application file for complete search history.

(56) References Cited

U.S. PATENT DOCUMENTS

| | | | |
|---|---|---|---|
| 7,056,826 B2 | 6/2006 | Wu | |
| 7,078,336 B2 | 7/2006 | Cheng | |

(Continued)

OTHER PUBLICATIONS

Iacovo et al., "The unique properties of SiCN as bonding material for hybrid bonding" Published in: 2021 7th International Workshop on Low Temperature Bonding for 3D Integration (LTB-3D).

(Continued)

*Primary Examiner* — Tong-Ho Kim
(74) *Attorney, Agent, or Firm* — Seed Intellectual Property Law Group LLP

(57) ABSTRACT

Low-k, carbon-rich silicon carbonitride or silicon oxycarbonitride interlevel dielectric layers having good copper and oxidation barrier properties are employed to facilitate the manufacture and reliability of integrated circuits, including structures including back side power rails. Such interlevel dielectric layers enable copper to copper or copper to metal bonding without copper or metal diffusion into dielectric material, even with some misalignment.

20 Claims, 8 Drawing Sheets

(51) Int. Cl.
   H10W 20/41     (2026.01)
   H10W 20/48     (2026.01)

(56)            References Cited

U.S. PATENT DOCUMENTS

| 7,252,875 | B2 | 8/2007 | Cohen |
| 7,947,579 | B2 | 5/2011 | Jiang |
| 8,158,521 | B2 | 4/2012 | Chang |
| 8,349,746 | B2 | 1/2013 | Xie |
| 8,431,436 | B1 | 4/2013 | Nguyen |
| 8,779,600 | B2 | 7/2014 | Nguyen |
| 9,018,767 | B2 | 4/2015 | Bonilla |
| 9,111,761 | B2 | 8/2015 | Gates |
| 9,245,848 | B2 | 1/2016 | Duong |
| 9,312,224 | B1 | 4/2016 | Canaperi |
| 9,431,235 | B1 | 8/2016 | Nguyen |
| 9,735,005 | B1 | 8/2017 | Haigh, Jr. |
| 9,837,262 | B2 | 12/2017 | Sasajima |
| 10,211,047 | B2 | 2/2019 | Nguyen |
| 10,937,892 | B2 | 3/2021 | Canaperi |
| 11,127,740 | B2 | 9/2021 | Lee |
| 11,251,076 | B2 | 2/2022 | King |
| 2006/0022348 | A1 | 2/2006 | Abell |
| 2011/0012238 | A1* | 1/2011 | Cohen ............... H01L 21/76832 |
| | | | 257/637 |
| 2015/0108644 | A1* | 4/2015 | Kuang .................... H01L 25/50 |
| | | | 257/777 |
| 2021/0028112 | A1* | 1/2021 | Kim ................... H10D 84/0158 |
| 2021/0296580 | A1* | 9/2021 | Shen ................. H10N 70/8828 |
| 2022/0367454 | A1* | 11/2022 | Chung ................... H10D 30/62 |

OTHER PUBLICATIONS

Onishi et al.,, "Low-Temperature Chemical Vapor Deposition of SiCN for Hybrid Bonding" Published in: 2022 International Conference on Electronics Packaging (ICEP), Date of Conference: May 11-14, 2022 Publisher: IEEE.

Fumihiro et al., "Influence of Composition of SiCN as Interfacial Layer on Plasma Activated Direct Bonding" Published Jun. 19, 2019. Published by ECS Journal of Solid State Science and Technology. pp. 13.

Nguyen et al., "Robust Low k C-rich SiCN Interlevel Dielectric with Ultrathin Barrier for Novel RC Reduction in BEOL Cu-Low K SiCN Interconnects" International Interconnect Technology Conference, Jun. 2-5, 2019, Paper 5, Proceeding IITC, Brussel, Belgium.

Beyne et al., "Scalable, sub 2μm pitch, Cu/SiCN to Cu/SiCN hybrid wafer-to-wafer bonding technology" Published in: 2017 IEEE International Electron Devices Meeting (IEDM). Date Added to IEEE Xplore: Jan. 25, 2018.

Peter Mell and Timothy Grance, The NIST Definition of Cloud Computing, NIST Special Publication 800-145, Sep. 2011, cover, pp. i-iii and 1-3.

* cited by examiner

*FIG. 4*

| SAMPLE | REFERENCE SiCOH | SiCNH | SiCNOH (1 sccm N2O) | SiCNOH (5 sccm N2O) | SiCNOH (4 sccm N2O) | SiCNOH (3 sccm N2O) |
|---|---|---|---|---|---|---|
| FILMS | AS-DEP, LONG EXPOSED IN AIR | AS-DEP, EXPOSED IN AIR | AS-DEP, EXPOSED IN AIR | AS-DEP, EXPOSED IN AIR | AS-DEP, EXPOSED IN AIR | AS-DEP, EXPOSED IN AIR |
| ATOMIC % C | 22.98 | 56.19 | 55.93 | 54.54 | 54.05 | 54.11 |
| ATOMIC % O | 41.45 | 2.66 | 2.73 | 4.54 | 4.74 | 4.68 |
| ATOMIC % F | 0.35 | 0.16 | 0.41 | 1.65 | 1.73 | 1.77 |
| ATOMIC % Si | 34.66 | 33.66 | 33.51 | 32.34 | 32.28 | 32.29 |
| ATOMIC % N | 0.57 | 7.33 | 7.42 | 6.92 | 7.20 | 7.20 |

*FIG. 5A*

| | NHx+OH | CH3/CH2 | SiH | Si–CH2–Si | Si–CH3 | Si–O–SiC–SiN |
|---|---|---|---|---|---|---|
| pSiCNOH | 3.91 | 2.74 | 1.25 | 0.19 | 0.68 | 57.40 |
| C rich SiCNH | 2.29 | 4.09 | 4.16 | 0.13 | 0.58 | 67.91 |
| 5 sccm N2O | 2.11 | 4.10 | 3.96 | 0.14 | 0.61 | 69.64 |
| 4 sccm N2O | 2.28 | 4.21 | 4.18 | 0.13 | 0.61 | 69.77 |
| 3 sccm N2O | 2.22 | 4.19 | 4.16 | 0.13 | 0.62 | 72.61 |

*FIG. 5B*

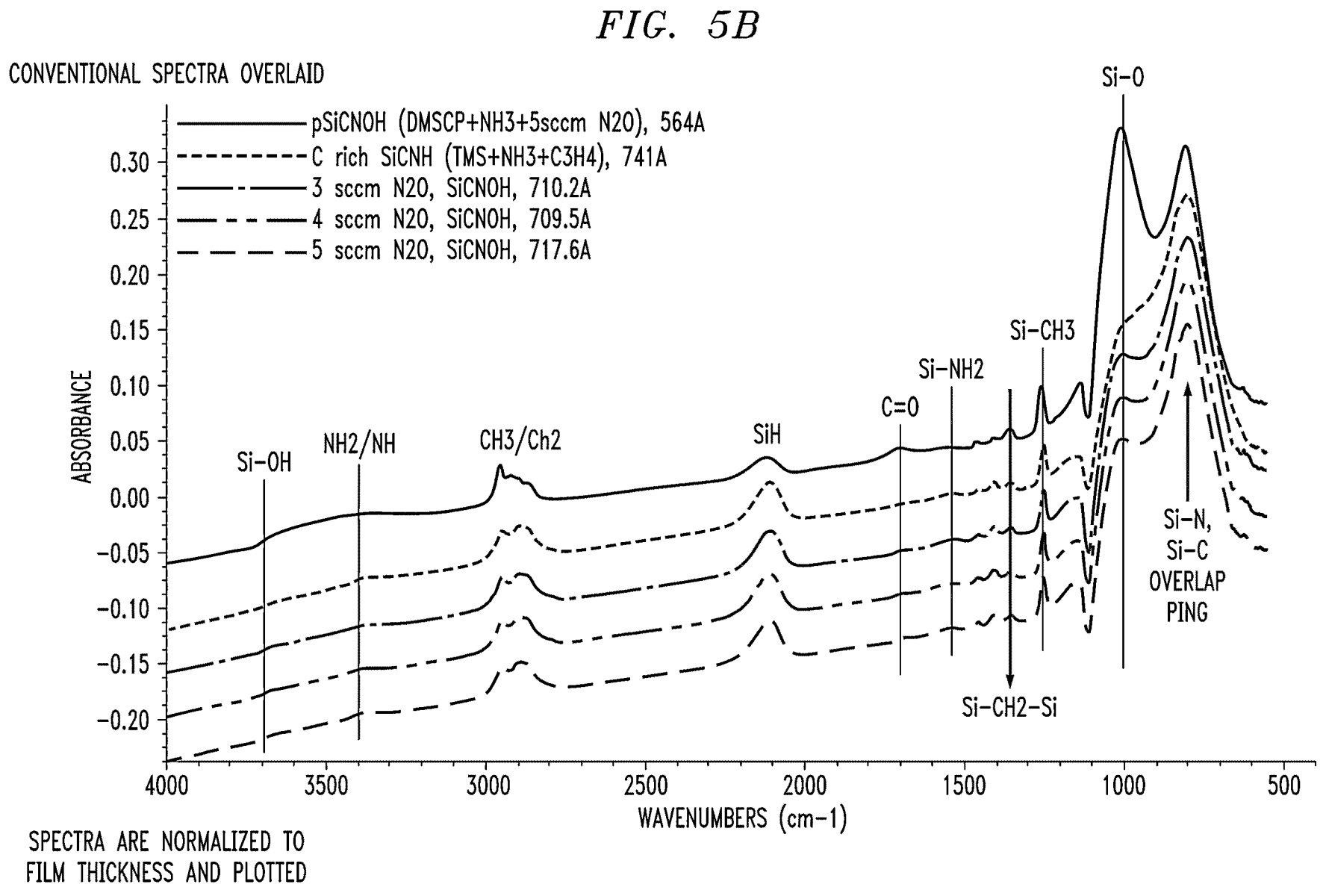

CONVENTIONAL SPECTRA OVERLAID

— pSiCNOH (DMSCP+NH3+5sccm N2O), 564A
--- C rich SiCNH (TMS+NH3+C3H4), 741A
—·— 3 sccm N2O, SiCNOH, 710.2A
—··— 4 sccm N2O, SiCNOH, 709.5A
— — 5 sccm N2O, SiCNOH, 717.6A

SPECTRA ARE NORMALIZED TO
FILM THICKNESS AND PLOTTED

*FIG. 6*

| FILM | PRECURSORS | PROCESS (PECVD) | THICKNESS REMOVAL 1X CYCLE | STANDARD PID (NORMALIZED TO SiCOH 2.7 & THICKNESS) | THICKNESS REMOVAL 5X | EXTEND 5X BHF PID |
|---|---|---|---|---|---|---|
| SiCOH 2.7 | $OMCTS+O_2$ | 350C | 30.3A | 1 | 45.5A | 1 |
| pSiCNOH | $DMSCP+NH_3+N_2O$ (5sccm) | 200C DEP + 350C UV CURE | 18.5A | 0.71 (0.4 FOR 2 Sccm N2O) | 81.9A | ~2 (12% POROSITY pSiCNOH ETCH FASTER IN LONG 5x DBHF) |
| C-Rich SiCNH | $TMS+NH_3+C_2H_4$ | 350C | 3.5A | 0.114 | 6.36A | 0.14 |
| C-Rich SiCNOH | $TMS+NH_3+C_2H_4 + N_2O$ (5 sccm) | 350C | 2.5-2.9A | 0.09-0.11 | 5.5+/-0.8A | 0.12-0.13 |
| C-Rich SiCNOH | $TMS+NH_3+C_2H_4 + N_2O$ (4 sccm) | 350C | 2.42A | 0.098 | 5.1A | 0.137 |
| C-Rich SiCNOH | $TMS+NH_3+C_2H_4 + N_2O$ (3 sccm) | 350C | 3.87 | 0.15 | 5.5A | 0.149 |

METAL INTERCONNECT LAYERS FOR FET ARCHITECTURES

BACKGROUND

The present invention relates generally to the electrical, electronic and computer arts and, more particularly, to FET architectures having metal interconnect layers for enabling copper to copper or copper to metal bonding.

With shrinking dimensions of various integrated circuit components, transistors such as field-effect transistors (FETs) have experienced dramatic improvements in both performance and power consumption. These improvements may be largely attributed to the reduction in dimensions of components used therein, which in general translate into reduced capacitance, resistance, and increased through-put current from the transistors. Metal oxide semiconductor field-effect transistors (MOSFETs) are well suited for use in high-density integrated circuits. As the size of MOSFETs and other devices decreases, the dimensions of source/drain regions, channel regions, and gate electrodes of the devices, also decrease.

FinFET, nanosheet and vertical transport FETs have been under development for possible use in tight pitch applications. Nanosheet FETs include multiple channel layers, each channel layer being separated by a gate stack including a layer of electrically conductive gate material and a gate dielectric layer. The gate stacks wrap around all sides of the channel layers, thereby forming gate-all-around (GAA) structures. Epitaxial regions on the ends of the nanosheet channel layers form source/drain regions of the nanosheet FETs.

The use of both front side contacts and back side contacts can facilitate the fabrication and performance of integrated circuits. By providing contacts on both sides of a chip, contact spacing can be greater than if only one side (for example, the front side) includes all contacts for the FETs. Back side power rails can be electrically connected to back side source/drain contacts.

Technologies including metal interconnect structures have been developing for electrically connecting electronic components. Heterogeneous integration (HI) technology refers to the integration of separately manufactured components into a higher-level assembly. HI technology may include the use of through silicon via (TSV) technology, which employs metal-filled vias through which the signal interconnections between the upper and lower layers of a chip in the vertical direction can be achieved. The interlevel dielectric (ILD) layers employed in metal interconnect structures have typically included compounds such as SiOx, SiOxFy or SiCOH.

Misalignment of copper elements can lead to copper diffusion into the adjoining dielectric layer and thereby impact device reliability. In addition to copper diffusion issues that may arise from misalignment during processing, the bonding of copper elements having different sizes or patterns may further result in copper diffusion into the adjoining dielectric layer, thereby creating reliability issues.

BRIEF SUMMARY

In a first aspect of the invention, a multi-layer semiconductor structure includes a device layer including field-effect transistors and having a front side and a back side, a first interconnect layer above the front side of the device layer and electrically connected to the device layer, and a back side power distribution network below the back side of the device layer. The back side power distribution network includes a top metal interconnect layer, a bottom metal interconnect layer, and bottom vias electrically connecting the top metal interconnect layer and the bottom metal interconnect layer. Through silicon vias extend vertically within a silicon substrate located between the back side power distribution network and the device layer, the through silicon vias being electrically connected to the device layer and having bottom ends adjoining the top metal interconnect layer of the back side power distribution network. A silicon carbonitride and/or silicon oxycarbonitride low-k interlevel dielectric layer beneath the silicon substrate has a composition of greater than fifty atomic percent carbon, less than ten atomic percent nitrogen, and less than ten atomic percent oxygen. A top surface of the low-k interlevel dielectric layer adjoins the silicon substrate. The top metal interconnect layer and the bottom vias are embedded within the low-k interlevel dielectric layer.

Power rails optionally extend within the silicon substrate, are electrically connected to the device layer, and have bottom ends adjoining the through silicon vias. The low-k interlevel dielectric layer may, but is not necessarily a silicon oxycarbonitride layer having a 53-59 atomic percentage carbon, 32-33 atomic percentage silicon, 3-4 atomic percentage oxygen, and 6-7 atomic percentage nitrogen. The low-k interlevel dielectric layer is preferably but not necessarily non-porous and exhibits compressive stress. If the low-k interlevel dielectric layer is porous, porosity is less than fourteen percent.

A multi-layer semiconductor structure in accordance with a further aspect includes a device layer including field-effect transistors within a front side interlevel dielectric layer, each of the field-effect transistors including a channel region, a gate stack adjoining the channel region, and first and second source/drain regions extending laterally from the channel region. A back-end-of-line interconnect layer over the front side of the device layer is electrically connected to the device layer. The multi-layer semiconductor structure further includes a back side power distribution network. A silicon carbonitride and/or silicon oxycarbonitride low-k back side interlevel dielectric layer is between the device layer and the back side power distribution network. The low-k back side interlevel dielectric layer has a composition of greater than fifty atomic percent carbon, less than ten atomic percent nitrogen, and less than ten atomic percent oxygen. Electrically conductive interconnects are embedded within the low-k back side interlevel dielectric layer. The device layer and the back side power distribution network are electrically connected by the electrically conductive interconnects.

The multi-layer semiconductor structure optionally includes power rails embedded within the low-k back side interlevel dielectric layer, the electrically conductive interconnects being electrically connected to the power rails. The low-k back side interlevel dielectric layer in some, but not all embodiments includes 53-59 atomic percentage carbon, 33-34% atomic percentage silicon, 3-4% atomic percentage oxygen, and 6-7% atomic percentage nitrogen. In some embodiments, the low-k back side interlevel dielectric layer is a silicon oxycarbonitride layer having at least fifty-three atomic percentage carbon.

The low-k back side interlevel dielectric layer is optionally porous with a porosity of fourteen percent or less. Alternatively, the low-k back side interlevel dielectric layer is non-porous and exhibits desirable compressive stress.

A method of fabricating a multi-layer semiconductor structure includes forming a device layer including field-effect transistors, forming one or more front side metal interconnect layers over a front side of the device layer, and forming a back side interconnect layer over a back side of the device layer. A low-k interlevel dielectric layer and metal conductors embedded within the low-k interlevel dielectric layer form the back side interconnect layer. The low-k interlevel dielectric layer includes silicon carbonitride and/or silicon oxycarbonitride having a composition of greater than fifty atomic percent carbon, less than ten atomic percent nitrogen, and less than ten atomic percent oxygen.

The low-k interlevel dielectric layer exhibits compressive strain and comprises silicon oxycarbonitride having at least fifty-three atomic percentage carbon in some embodiments of the back side interconnect layer formed in accordance with the method. For example, a silicon oxycarbonitride low-k interlevel dielectric layer includes 53-59 atomic percentage carbon, 32-33 atomic percentage silicon, 3-4 atomic percentage oxygen, and 6-7 atomic percentage nitrogen in some preferred embodiments of the method. Alternatively, the low-k interlevel dielectric layer, or a portion thereof, may be porous with a porosity of fourteen percent or less.

Techniques and structures as disclosed herein can provide substantial beneficial technical effects. Some embodiments may not have these potential advantages and these potential advantages are not necessarily required of all embodiments. By way of example only and without limitation, one or more embodiments may provide one or more of the following advantages:

Improved contact routing ability;

Interlevel dielectric with high modulus, low plasma induced damage, built-in copper (metal) diffusion and oxidation barrier properties and low dielectric constant;

Benefits of backside power delivery network technology;

Allows relatively thin barrier liners for high aspect ratio through silicon vias;

Reduction of potential copper (Cu) diffusion to dielectrics in the event of barrier liner defects or misalignment in Cu—Cu bonding;

Enabling contact of different sizes or patterns of lines or pillars with tolerance for misalignment without causing copper diffusion;

Superior time-dependent dielectric breakdown (TDDB) properties.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 4 is a chart showing the dielectric compositions of ILD layers in accordance with exemplary embodiments of the invention;

FIG. 5A is a chart showing relative bond levels of ILD materials in accordance with exemplary embodiments of the invention;

FIG. 5B is a graph showing FTIR (Fourier-transform infrared spectroscopy) of various dielectric materials; and FIG. 6 is a chart showing relative levels of plasma induced damage on selected ILD materials resulting from a reactive ion etch using oxygen and a buffered hydrofluoric acid etch.

Figure 1:
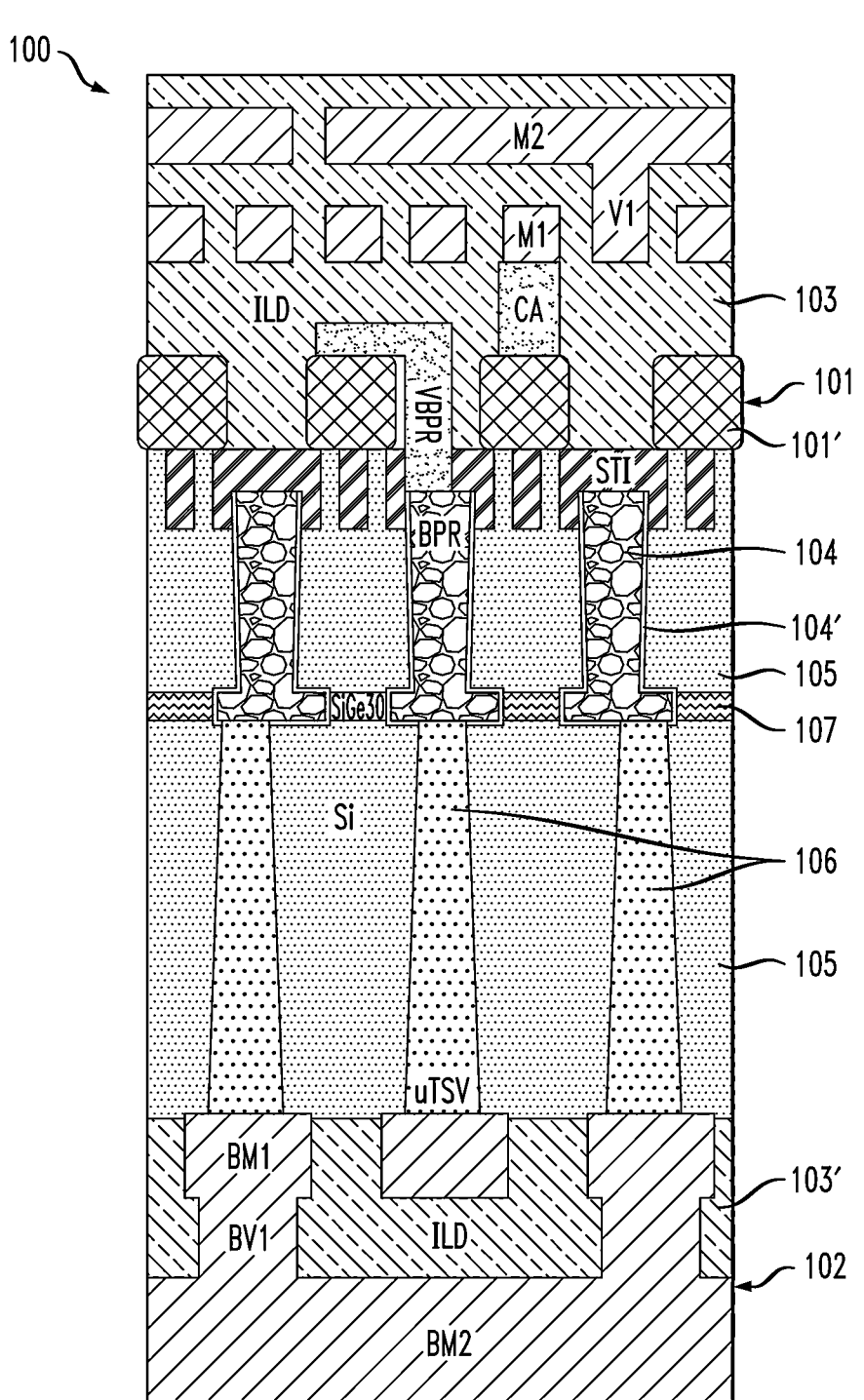
FIG. 1 is a schematic, cross-sectional view of a semiconductor structure including buried rails electrically connected to a back side power delivery network by through silicon vias (TSVs)

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Bonding misalignment and liner defects leading to copper diffusion into dielectric materials may adversely impact the performance and reliability of integrated circuits. The bonding of metal layers including different metal patterns or feature sizes, where contact only between specific region(s) is desired and other regions are to be blocked by dielectric material, may also lead to unwanted copper diffusion. The use of low-k, carbon-rich SiCNH (silicon carbonitride) or SiCNOH (silicon oxycarbonitride) interlevel dielectric layers having good copper diffusion/oxidation barrier properties and other desirable properties such as high modulus, good adhesion to an adjoining underlayer and likely high thermal conductivity with more Si—C bonding, as described further herein, facilitate the manufacture and reliability of integrated circuits, including structures including back side power rails.

The use of back side contacts in addition to front side contacts may facilitate the manufacture and performance of integrated circuits, particularly those including relatively small elements and increased packing density. Gate-allaround (GAA) transistors such as nanosheet transistors and fin-like field effect transistors (FinFETs) are among the elements employed in high-density, high-performance applications. Contacts, wires, and other metal interconnecting structures and the ILD layers as disclosed herein may be employed, for example, in association with integrated circuits including either nanosheet or FinFET transistors. The high thermal conductivity and other properties such as higher modulus/harness of carbon-rich SiCNH and SiCNOH, due to high Si—C bonding, make such compounds suitable for use as ILD layers in structures including back side power delivery networks (BSPDNs). The properties of carbon-rich SiCNOH having element composition ranges and/or porosity as described further below make the compound particularly suitable for some ILD layers. These properties together with the compressive stress thereof make the ILD layers as described herein more suitable for dielectric to dielectric and Cu to Cu bonding in fabrication processes including back side bonding of 3D power distribution networks. Fewer defects and much less undesirable Cu diffusion will occur due to misalignment since the dielectric itself is a Cu diffusion barrier.

An exemplary nanostructure 100 including a multi-layer back side power distribution network (BSPDN) 102 and front side metal interconnect layers M1, M2 that are electrically connected by via(s) V1 is schematically illustrated in FIG. 1. A device layer 101 comprising field-effect transistors is electrically connected to the M1 interconnect layer by front side contacts CA formed on selected source/drain regions 101'. (Gate contacts are not shown.) The device layer 101, the M1 interconnect layer, and the M2 interconnect layer comprise interlevel dielectric layers that electrically isolate the electrically conductive elements within such layers. The interlevel dielectric layer 103 as shown in FIG. 1 may comprise multiple dielectric layers that may or may not comprise the same dielectric material.

The BSPDN 102 includes a top metal interconnect layer BM1 and a bottom metal interconnect layer BM2. The top metal interconnect layer BM1 of the BSPDN is electrically connected to buried metal (power) rails (BPRs) 104 by through silicon vias (TSVs) 106 that extend vertically through a portion of a silicon substrate 105. Some of the buried power rails are electrically connected to the device layer 101 by via(s) VBPR formed in the ILD layer 103 and extending through shallow trench isolation regions (STIs) formed within the silicon substrate 105. A patterned etch stop layer 107 includes relatively wide openings therein. The BPRs extend within the openings in the patterned etch stop layer 107 and include bottom portions having expanded lateral widths, as shown in the cross-sectional view provided in FIG. 1. In some embodiments, the etch stop layer comprises silicon germanium. The expanded widths of the bottom portions of the BPRs provide relatively large areas for contact with the TSVs, allowing for possible misalignment of the TSVs with respect to the BPRs while still enabling electrical continuity between the elements.

In some embodiments, the TSVs comprise a metal barrier liner (not shown) that protects against copper diffusion into adjoining semiconductor material and a copper core. The buried metal rails 104 also include metal barrier liners 104' that adjoin the semiconductor substrate and etch stop layer 107. The metal barrier liners can be formed using various processes, including chemical vapor deposition (CVD), plasma enhanced CVD (PECVD), atomic layer deposition (ALD), physical vapor deposition (PVD), sputtering, chemical solution deposition or plating.

The ends of the TSVs may be revealed following metal overburden removal using a wafer thinning process. The device layer 101 of the exemplary nanostructure 100, which may include field-effect transistors and other electronic devices, is electrically connected to the BSPDN 102, which enables the metal lines comprising the M1 layer to be employed as signal tracks while power is supplied from the BSPDN. The BSPDN 102 is bonded to the layer of the nanostructure 100 that comprises the TSVs in some embodiments.

The integrity of the metal barrier liner(s) employed in the exemplary nanostructure is typically important to the reliability of the integrated circuit(s) therein. Proper alignment of the various metal layers within the exemplary nanostructure may also impact reliability should misalignment contribute to copper diffusion within the dielectric materials of the exemplary nanostructure. The interlevel dielectric (ILD) layer 103' between the top and bottom metal interconnect layers BM1, BM2 of the BSPDN 102 are effective copper diffusion barriers in the exemplary nanostructure. The employment of such an ILD layer 103' reduces potential reliability issues that may arise from misalignment of metal elements within the exemplary nanostructure, such as the misalignment of the TSVs with respect to the BM1 interconnect layer or between the vias BV1 and the BM2 interconnect layer. The ILD layer 103' can further reduce reliability issues due to a possibly ineffective metal barrier liner(s).

Either or both of the ILD layers 103, 103' may comprise low-k SiCNOH or SiCNH having an atomic percentage of carbon greater than fifty percent (50%). The atomic percentages of nitrogen and oxygen are each less than ten percent (10%). In a preferred embodiment, at least the ILD layer 103' comprises a silicon oxycarbonitride layer that comprises 53-59 atomic percentage carbon, 32-33 atomic percentage silicon, 3-4 atomic percentage oxygen, and 6-7 atomic percentage nitrogen. FIG. 4 includes a chart illustrating five exemplary ILD materials (S2 through S6) of ILD materials comprising silicon, carbon, nitrogen, and possibly oxygen, as well as the dielectric composition of SiCOH (S1), a commonly used ILD material. (The exemplary ILD materials are hydrogenated.) The oxygen in materials S2 and S3 sample are baseline surface contamination from air (about 2.66 Atomic % in the case of S2). The S3 material is exposed in air a little longer so surface oxygen contamination is increased to 2.73 atomic % and this calibrates the SiCNOH base line. Fluorine (F) levels in the chart also represent surface contamination in the chamber in which the dielectric compositions are formed. Insertion of $N_2O$ increases both oxygen (~5 atomic %) and F contamination.

The ILD layers 103, 103' are optionally lightly porous (e.g. pSiCNOH), up to about fourteen (14%) porosity in some exemplary embodiments. In general, high porosity pSiCNOH will have reduced k, but porosity higher than 14% volume will weaken modulus strength and the resulting pSiCNOH dielectric material will have less effective Cu diffusion properties. In addition to having high thermal conductivity due to high Si—C bonding and exhibiting compressive stress, the ILD layers effectively limit copper diffusion. Relatively thin metal barrier liner(s) can be employed in nanostructures using ILD layers as described herein as their integrity will not materially affect reliability, unlike nanostructures that employ ILD layers comprising dielectric materials such as SiOx or SiCOH. Metal barrier liners adjoining vias BV1 embedded in the low-k, carbon-rich SiCNOH or SiCNH ILD layers as provided herein may be in the range of 1.5-20 nm. Such SiCNOH or SiCNH ILD layers can adhere directly to the metal barrier liners. In contrast, metal barrier liners of vias embedded in SiOx or SiCOH ILD layers would typically be in the range of >4 to 20 nm to provide a satisfactory copper diffusion barrier. An SiCNOH ILD layer adheres to metal, such as metal barrier layers commonly employed within vias and other metal interconnect structures. A flowable chemical vapor deposition (FCVD) process or other suitable process can be employed in some embodiments for forming a SICNOH ILD layer using appropriate precursors, as described further below.

In an alternative embodiment, low-k, carbon-rich SiCNH may be employed as an ILD layer or a portion thereof in the exemplary nanostructure 100. In general, SiCNOH ILD is preferred. This is due to a small atomic percentage of oxygen that will make SiCNOH dielectrics have slightly reduced k and less sensitivity to moisture since some oxygen is already in the film. It will also stabilize the structure, preventing addition oxidation. Accordingly, C-rich SiCNOH with a small amount of oxygen incorporation is preferable as ILD layers 103, 103' for the exemplary embodiments described herein. Both SiCNH and SiCNOH have relatively high thermal conductivity, which is beneficial for use in association with vias and within BSPDNs. If employed, the atomic percentage of carbon of a low-k SiCNH ILD layer or portion thereof should be greater than fifty percent and the atomic percentage of nitrogen should be less than ten percent, for example about seven percent. Carbon-rich SiCNH adhesion bonding to TaN, Co, or Ru may be in the range of 4.2-5.3 $J/m^2$. Carbon-rich SiCNH bonding to copper is about 5.2 $J/m^2$.

Deposition methods such as chemical vapor deposition (CVD), plasma enhanced chemical vapor deposition (PECVD), plasma enhanced atomic layer deposition (PE ALD) and flowable chemical vapor deposition (FCVD) may be used to obtain the low-k ILD layers in which vias or other electrical interconnect elements may be embedded. Deposition precursors for a SiCNOH and/or SiCNH ILD layer include carbosilane, organosilicon compounds, and nitrogen, oxygen and hydrocarbon reactants. Commercial tooling can be employed. FCVD SiCNOH is capable of filling high aspect ratio gaps in embodiments wherein gap-filling is required. FCVD is followed by UV curing.

In one exemplary embodiment, a carbon-rich SiCNH ILD layer is formed using a PECVD system using trimethyl silane (TMS), ammonia ($NH_3$) and $C_2H_2$ precursors at 350° C. using 13.56 MHz frequencies. A non-porous SiCNH layer having a dielectric constant of about 3.3 and exhibiting compressive stress may be obtained. In a further exemplary embodiment, a carbon-rich SiCNOH ILD layer is formed in a PECVD process using TMS, $NH_3$, $C_2H_4$ and $N_2O$ precursors at 350° C. The $N_2O$ gas flow rate, expressed in standard cubic centimeters per minute (sccm), is one to five in exemplary embodiments. As discussed, hereafter, the $N_2O$ gas flow rate affects various physical properties of the resulting ILD layer. The non-porous, carbon-rich SiCNOH ILD layers obtained by the PECVD processing as described are all characterized by low dielectric constants, compressive stress, high modulus, low plasma-induced damage (PID), good copper diffusion barrier properties, and good oxidation barrier properties. All such SiCNOH layers are amenable to chemical mechanical polishing (CMP) processes and provide excellent adhesion to metal, for example copper, cobalt, and ruthenium. The dielectric constant of the ILD layers is 3.2-3.3 in one or more embodiments.

Lightly porous, carbon-rich ILD layers are another option for the exemplary nanostructure. For example, a low-k pSiCNOH ILD layer may be obtained from a PECVD process using carbon-rich cyclic dimethyl-silacyclopentane (DMSCP), $NH_3$, $C_2H_4$ and $N_2O$ precursors at 200° C. followed by a UV cure at 385° C. Unlike dense SiCNOH as described above, pSiCNOH exhibits tensile stress. SiCNOH films with compressive stress will create less Si wafer bowing (and subsequent defects) in Si wafer/devices stacks as compared to pSiCNOH tensile stress film, making SiCNOH ILD films preferable for device fabrication. It will be appreciated that, as alternatives to TMS and DMSCP, other carbosilanes, carbon-rich carbosilanes, and carbosilazane can be employed as precursors. The carbosilazane can be cyclic or linear. Suitable cyclic silazanes include one or more of tetramethylcyclotetrasilazanes, hexamethylcyclotetrasilazanes, and ocytamethylcyclotetrasilazanes, and combinations thereof. Some specific examples of cyclic silazanes include 1,2,3,4 tetramethylcyclotetrasilazane, 1,1,3,3 tetramethylcyclotetrasilazane, 1,1,3,3,5,5 hexamethylcyclotetrasilazane, 1,2,3,4,5,6 hexamethylcyclotetrasilazane, 1,1,3,3,5,5,7,7 octamethylcyclotetrasilazen, and 1,2,3,4,5,6,7,8 octamethylcyclotetrasilazane. Suitable linear silazanes include hexamethyldisilazane. Suitable silanes may further include diethylamine silane (BDEAS), bis(tertiarybutylamino) silane (BTBAS), and tris(dimethylamino) silane (TDMAS). Carbon-silane containing precursor comprises at least one of methylsilane, dimethylsilane, trimethylsilane, tetramethyl silane, ethylsilane, and other similar carbon silanes.

Oxygen-based sources that may be employed during PECVD deposition of a SiCNOH layer may include $N_2O$, as indicated above, or alternatively $O_2$, $H_2O$, $H_2O_2$, $O_3$ or $N_2O_2$. In general, less reactive oxygen precursors are preferred for better oxygen control in the layer to be deposited. A nitrogen precursor may include ammonia, hydrazine ($N_2H_4$), methyl hydrazine, dimethyldrazine, t-butylhydrazine, phenylhydrazine, other hydrazine derivatives, amines, or a nitrogen plasma source (e.g., $N_2$, $N_2/H_2$, $NH_3$, or $N_2H_4$ plasmas), 2,2'-azotertbutane, organic or alkyl azides, such as methylazide, ethylazide, trimethylsilylazide, ($Me_3SiN_3$), and other suitable nitrogen sources. Radical nitrogen compounds can be produced by heat, hot-wires and/or plasma, such as $NH_3$, $N_2$, $N_2H_4$. In one or more exemplary embodiments, the nitrogen-containing gas contains ammonia. The nitrogen-containing gas may have a flow rate within a range from about 50 sccm to about 2,000 sccm, preferably from about 100 sccm to about 1,500 sccm. In various examples, the nitrogen-containing gas may have a flow rate of about 100 sccm, 500 sccm, 1,000 sccm or 1,500 sccm. Carbon-containing sources include hydrocarbon such as methane, ethylene, ethyne, propane, propene, and butylene, preferable as a gas source for better carbon control and incorporation in the deposited ILD layer.

In summary, the exemplary nanostructure 100 includes a device layer 101 having a front side and a back side. Interconnect layers such as layers M1 and M2 are positioned above the front side of the device layer and are electrically connected to the device layer. A back side power distribution network 102 below the back side of the device layer includes a top metal interconnect layer BM1, a bottom metal interconnect layer BM2, and bottom vias BV1 electrically connecting the top metal interconnect layer and the bottom metal interconnect layer. A silicon substrate 105 is between the back side power distribution network and the device layer. Through silicon vias 106 extend vertically within the silicon substrate 105 and are electrically connected to the device layer by buried rails 104. The bottom ends of the through silicon vias adjoin the top metal interconnect layer BM1 of the back side power distribution network 102. A silicon carbonitride and/or silicon oxycarbonitride low-k interlevel dielectric layer 103' having a composition of greater than fifty atomic percent carbon, less than ten atomic percent nitrogen, and less than ten atomic percent oxygen has a top surface adjoining the silicon substrate 105. The top metal interconnect layer and the bottom vias BV1 are embedded within the low-k interlevel dielectric layer. The low-k interlevel dielectric layer is a monolithic layer in one or more embodiments having uniform physical characteristics.

Figures 2A, 2B, 2C:
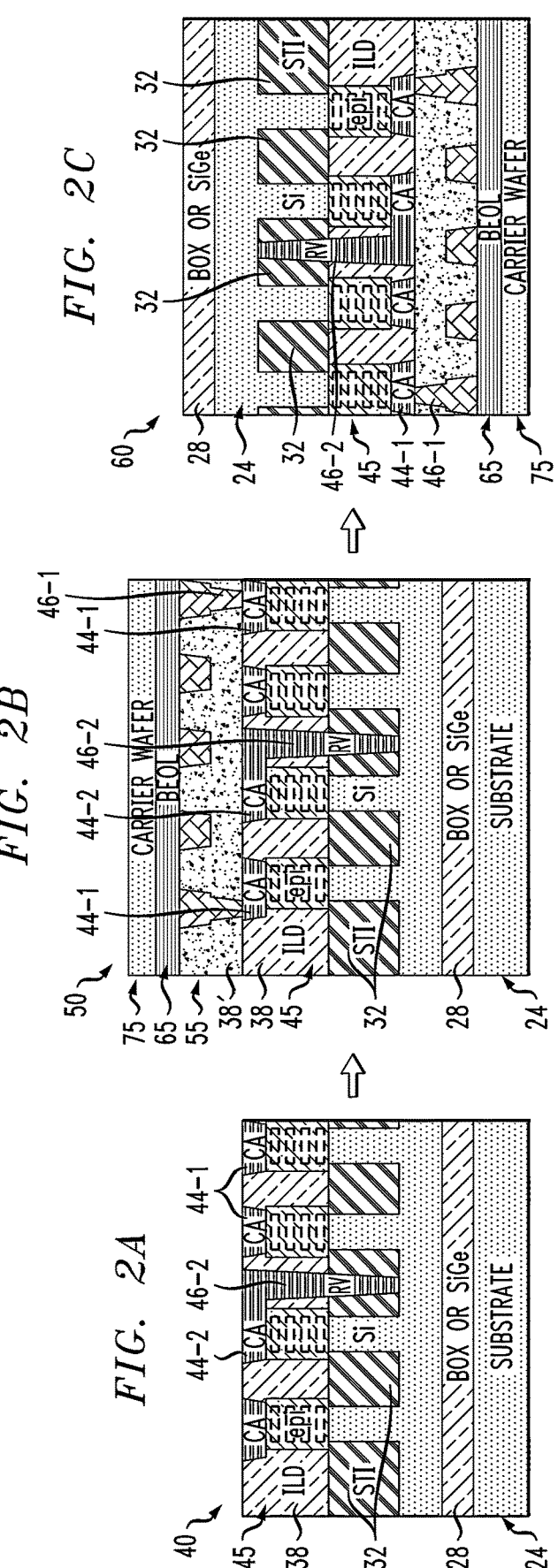
FIG. 2A is a schematic, cross-sectional view of a structure including nanosheet transistors, metal contacts, and via(s) electrically connected to selected metal contacts.
FIG. 2B is a schematic, cross-sectional view thereof following formation of a middle-of-line (MOL) metal layer, a back-end-of-line (BEOL) metal layer, and bonding of a carrier wafer.
FIG. 2C is a schematic, cross-sectional view thereof following wafer flip and substrate removal.

FIG. 2A through FIG. 2E illustrate an exemplary sequence of steps that may be employed for the fabrication of integrated circuits including frontside and backside contacts. An exemplary, partially completed monolithic semiconductor structure 40 is shown in FIG. 2A. The monolithic semiconductor structure 40 includes gate-all-around (GAA) nanosheet transistors, each comprising a stack of semiconductor channel layers, a gate stack, and source/drain regions, all formed over a semiconductor substrate. An exemplary substrate includes a silicon substrate layer 24 and an etch stop layer 28 within the silicon substrate layer 24. The etch stop layer can be, for example, a buried oxide (BOX) layer or a silicon germanium layer. Methods of fabricating nanosheet transistors are known to the art and continue to be developed.

In one or more exemplary embodiments, the semiconductor channel layers each have a thickness in the range of four to ten nanometers (4-10 nm). The number of semiconductor (channel) layers in the vertical stack may vary depending on the desired uses and capabilities of the nanosheet transistors to be fabricated. The semiconductor channel layers are essentially monocrystalline silicon layers and are spaced ten to twenty nanometers (10-20 nm) apart in some embodiments. The dimensions of the semiconductor channel layers and the vertical spacing of channel layers should be considered exemplary as opposed to limiting.

The vertical nanosheet stacks depicted in FIG. 2A can be obtained by epitaxially growing silicon and sacrificial silicon germanium layers, respectively, on a semiconductor substrate in alternating sequence to obtain a layered stack having the desired number of silicon (channel) layers. The terms "epitaxially growing and/or depositing" and "epitaxially grown and/or deposited" mean the growth of a semiconductor material on a deposition surface of a semiconductor material in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

The sacrificial silicon germanium layers (not shown) are replaced later in the process by metal gate and gate dielectric materials that comprise the gate stacks. The sacrificial silicon germanium layers may have the composition $Si_{1-x}Ge_x$ where x is between 0.2 and 0.3 to allow selective etching with respect to silicon. In one exemplary embodiment, the sacrificial silicon germanium layers and the etch stop layer 28 have the composition $Si_{1-x}Ge_x$ where x is about 0.3. The width of each semiconductor channel layer in the top, fin-like portions of an exemplary monolithic structure is fifteen nanometers (15 nm) or greater in some embodiments. Shallow trench isolation (STI) regions 32 extend within the substrate 24 and electrically isolate selected regions of the structure. The bottom ends of the STI regions are at or above the etch stop layer 28.

Source/drain regions are epitaxially grown on the exposed edges of the silicon nanosheet channel layers following formation of inner spacers (not shown). Dopants may be incorporated within the source/drain regions in situ using appropriate precursors, as is known in the art. By "in-situ" it is meant that the dopant that dictates the conductivity type of a doped layer is introduced during the process step, for example epitaxial deposition, that forms the doped layer. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. In a silicon-containing substrate, examples of n-type dopants, i.e., impurities, include but are not limited to antimony, arsenic and phosphorous. Exemplary epitaxial growth processes that are suitable for use in forming silicon and/or silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). An nFET region(s) includes transistors having n-type source/drain regions while the pFET region(s) includes p-type source/drain regions. In one or more embodiments, both nFET and pFET regions are formed. Source/drain regions of nanosheet devices are typically grown prior to the RMG (replacement metal gate) process.

FIG. 2A provide views of an exemplary structure 40 obtained following sacrificial gate removal, release of sacrificial silicon germanium nanosheet layers, replacement gate formation, and deposition and planarization of a front side interlevel dielectric layer 38. Process steps for effecting gate replacement are known to the art and do not require detailed description. It will be appreciated that nanosheet transistor formation and the formation of other elements may continue to be developed. The processing steps described for obtaining the structure 40 should accordingly be considered exemplary and not limiting.

The front side interlevel dielectric (ILD) layer 38 may be deposited over the structure using deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), spin-on coating, sputtering, and/or plating. The front side ILD layer may include, but is not necessarily limited to, low-k materials (that is, k less than 4.0), such as, for example, porous silicates, carbon doped oxides, silicon dioxides, silicon oxynitrides, carbon-doped silicon oxide (SiCOH) and porous variants thereof, silsesquioxanes, siloxanes, or other dielectric materials having, for example, a dielectric constant in the range of about 2 to about 4. An SiCOH dielectric film having a dielectric constant (k) of about 2.7-2.8 can, for example, comprise one or more ILD layers. Such a dielectric film can be deposited using PECVD. ILD layers may, in some embodiments, comprise an ultra low-k (ULK) dielectric material having a dielectric constant of 2.5 or below. The front side ILD layer comprises multiple layers in some embodiments. The front side ILD layer fills the spaces between the transistors and extends down to the top surfaces of the STI regions 32.

The sacrificial gate layer (not shown) and the sacrificial silicon germanium layers are selectively removed, leaving stacks of silicon (channel) layers separated by spaces (not shown). Hydrogen chloride gas is employed in some embodiments to selectively remove silicon germanium, leaving silicon nanosheets substantially intact. Alternatively, a wet etch process containing ammonia and hydroperoxide can be used to etch SiGe selective to other materials. Gate stacks are formed in adjoining relation to the nanosheet (channel) layers. A gate dielectric layer forms portions of the gate stacks that replace the sacrificial silicon germanium nanosheet layers and adjoins the silicon channel layers. Gate metal is deposited over the gate dielectric layer. The gate stacks adjoin the silicon nanosheet channel layers, forming a gate-all-around structure.

Non-limiting examples of suitable materials for the gate dielectric layer include oxides, nitrides, oxynitrides, silicates (e.g., metal silicates), aluminates, titanates, nitrides, or any combination thereof. Examples of high-k gate dielectric materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material may vary depending on the deposition process as well as the composition and number of high-k dielectric materials used. In one exemplary embodiment, a high-k dielectric layer having a thickness of 2.5 nm is employed. In some embodiments, the gate dielectric layer includes multiple dielectric layers.

Electrically conductive gate material is deposited in the spaces formerly filled by the sacrificial gate and the silicon germanium nanosheet layers. The deposited metal gate material forms the metal gates of the nanosheet field-effect transistors of the resulting structure 40. In some embodiments, the electrically conductive gate includes a work function metal (WFM) layer. WFM serves dual purposes: Vt setting and gate conductor. Non-limiting examples of suitable work function metals include p-type work function metal materials and n-type work function metal materials. P-type work function materials include compositions such as ruthenium, palladium, platinum, cobalt, nickel, and conductive metal oxides, titanium nitride, or any combination thereof. N-type metal materials include, for example, hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, a conformal ALD process.

In one exemplary embodiment, an n-type WFM layer having a thickness of three nanometers (3 nm) may be formed on the gate dielectric layer. The thickness of the WFM layer may, for example, be in the range of two to ten nanometers (2-10 nm), with thinner layers being used as device scaling decreases. The n-type WFM layer is intended for use in association with the n-type transistors. Portions of the n-type WFM layer that may also be deposited in the pFET region may accordingly be replaced later in the process. The n-type WFM layer and the gate dielectric may fill the spaces between the silicon channel layers and the regions formerly occupied by the sacrificial gates.

The n-type WFM layer in the nFET region(s) may be protected by a patterned OPL (not shown). Exposed portions of the n-type WFM layer in the pFET region are removed, leaving open spaces between the silicon channel layers within the pFET region. Gate metal is accordingly removed from the pFET region while the protected nFET region remains intact. An SC1 etch or other suitable etch processes can be employed to selectively remove gate metal while leaving the gate dielectric layer substantially intact. The duration of the etch, which is sufficient to allow removal of all gate metal from the pFET region, does not affect the gate metal in the nFET region. Following removal of the originally deposited n-type WFM layer from the pFET region, new gate metal deemed appropriate for the pFET transistors is deposited. A p-type WFM layer is deposited in embodiments wherein the first-deposited metal is n-type. It will be appreciated that the process can be reversed and n-type metal can be deposited subsequent to p-type metal in some alternative embodiments. Metal overburden can be removed using chemical mechanical planarization (CMP). An FEOL (device) layer 45 comprising FETs and possibly other electronic devices (not shown) within the front side ILD layer 38 is accordingly provided.

Silicon-based devices typically include multiple interconnect metallization layers above a device (front-end-of-line/FEOL) layer 45 that contains field-effect transistors (FETs) and/or other electronic structures. FEOL processing includes high-temperature steps for manipulating semiconductor conductivity. Middle-of-line (MOL) processing includes steps typically used for fabricating metal contacts for logic circuitry components such as field-effect transistors (FETs), resistors, diodes, and capacitors. MOL processing may include intermediate-temperature steps for forming semiconductor-metal compounds (for example, silicides, germanosilicides) for electrical contacts. A middle-of-line (MOL) ILD layer is formed on the structure, planarized and then patterned. The MOL ILD layer may have the same composition(s) as the front side interlevel dielectric (ILD) layer 38 and be deposited using the same techniques. A first set of openings formed within the MOL ILD layer extend down to the top surfaces of selected source/drain regions. Other source/drain regions may remain protected by the ILD layers thereon. Gate contact openings (not shown) are also formed in the MOL ILD layer.

Source/drain contact and gate contact metallization includes filling front side via(s) that are electrically connected to source/drain contact(s) for electrically connecting the device layer to a back side power rail (not shown in FIG. 2A). Top (frontside) source/drain contacts can comprise electrically conductive material including, but not limited to, a silicide layer such as Ti, Ni, NiPt, a metal adhesion layer, such as TIN, TaN and conductive metal fills, such as tungsten (W), aluminum (Al), copper (Cu), cobalt (Co), ruthenium (Ru), molybdenum (Mo), or any other suitable conductive material, and combinations thereof. A metal silicide layer can be formed on the source/drain regions by depositing a metal liner such as a titanium liner thereon prior to deposition of the metal fill layers. Such a titanium liner can be deposited using physical vapor deposition (PVD), and is followed by annealing at a temperature between about two hundred and eight hundred degrees Centigrade to form the metal silicide. The structure may be annealed to form a metal silicide layer between the contact metal and the source/drain epitaxy. Each front source/drain contact 44-1, 44-2 (CA) forms an electrical connection to one of the source/drain regions. A via conductor 46-2 extends from a source/drain contact 44-2 through the front side ILD layer 38 and underlying STI region. The bottom end of the via conductor 46-2 adjoins the semiconductor substrate. Other via conductors 46-1 connect source/drain regions to the M1 wiring layer. Gate contacts (not shown) are also formed on the front side of the device layer. The gate contacts and the front side source/drain contacts may or may not be formed at the same time and may or may not comprise the same electrically conductive material(s).

Additional MOL ILD material is deposited over the structure and patterned. A metal wiring layer 55 (M1) is formed within the patterned MOL ILD layer 38' and includes tracks for electrically connecting one or more of the front side source/drain contacts and the gate contacts (not shown) with a BEOL layer(s) 65 formed above the MOL ILD layer. Vias 46-1 for electrically connecting one or more of the source/drain contacts 44-1 to the tracks are also formed in the MOL ILD layer 38'.

Back-end-of-line (BEOL) processing involves the creation of metal interconnecting wires that connect the devices formed in FEOL processing to form electrical circuits and may include silicidation as discussed above with respect to MOL processing. Metal interconnecting wires that connect the devices in the FEOL (device) layer 45, thereby forming electrical circuits, are formed within one or more BEOL layers 65 following MOL processing. The BEOL layers are formed over the front side of the device layer 45. The metal lines including the interconnecting wires in the BEOL layers are deposited in sequence over the device layer 45 and include dielectric layers. The interconnecting wires within each metal line are electrically connected to interconnecting wires in other metal lines and to the devices in the FEOL (device) layer 45. BEOL processing typically includes low-temperature steps for forming metal wires and preserving temperature sensitive FEOL and MOL structures. A chip may have multiple BEOL interconnect layers. Each interconnect layer, which has a wiring scheme, is connected to another interconnect layer by vias. The wires and vias are within dielectric layers, one or more of which may comprise low-k material.

A carrier wafer 75 is bonded to the resulting structure above the BEOL layer(s) 65. A bonding oxide layer may be deposited on each of the top BEOL layer and the carrier wafer. The carrier wafer is bonded to the BEOL layers by the bonding oxide layers and form a bonding oxide layer. An exemplary monolithic semiconductor structure 50 shown in FIG. 2B includes an FEOL (device) layer 45 comprising nFET and pFET transistors, optionally other electronic devices, an MOL layer comprising front side source/drain and gate contacts, and BEOL layer(s) 65 electrically connected to the devices in the device layer. The semiconductor structure 50 further includes a carrier wafer 75.

The semiconductor structure 50 is flipped and the portion of the silicon substrate layer 24 beneath the etch stop layer 28 is removed therefrom. A substrate grinding, chemical mechanical polishing (CMP) and selective wet process may be performed at this stage of the process. Ammonium hydroxide (NH$_4$OH) or tetramethylammonium hydroxide (TMAH) may be employed for wet process as their selectivity to silicon germanium is high. (As indicated above, the etch stop layer may comprise silicon germanium.) A monolithic structure 60, as illustrated in FIG. 2C may be obtained.

Figure 2E:
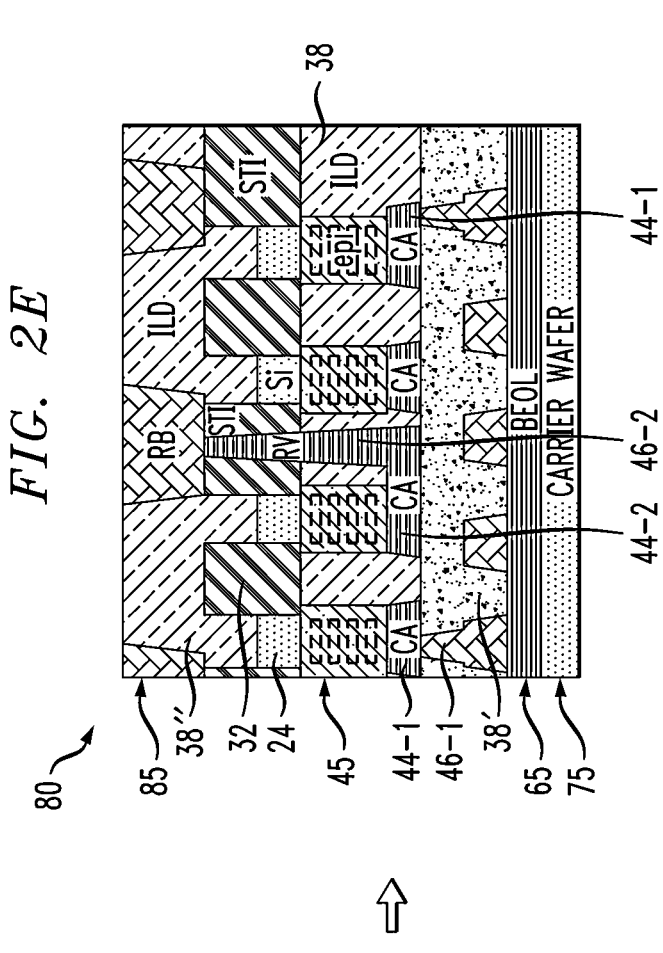
FIG. 2E is a schematic, cross-sectional view thereof following formation of a backside interlevel dielectric (BILD) layer and a back side power rail.
Figure 2D:
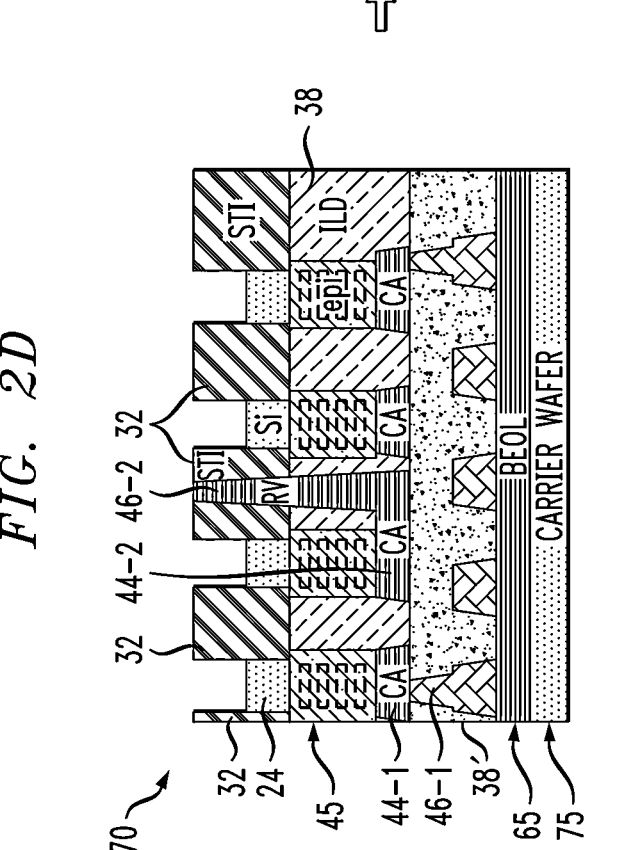
FIG. 2D is a schematic, cross-sectional view thereof following etch stop layer removal and recessing of a silicon layer.

The etch stop layer 28 is removed and the silicon substrate layer 24 is recessed, thereby obtaining a structure 70 as illustrated in FIG. 2D. Trenches between STI regions 32 are formed and an end of the via conductor(s) 46-2 is exposed.

A back side ILD (BILD) layer 38'' is deposited on the inverted structure 70 and planarized. The back side ILD layer 38'' may be formed by depositing a carbon-rich SiCNOH layer or a carbon-rich SiCNH layer. The back side ILD layer 38'' may be a single layer of SiCNOH having an atomic percentage of carbon exceeding fifty percent or a multilayer structure including both SiCNOH and SiCNH, each having an atomic percentage of carbon exceeding fifty percent and preferably greater than fifty-three percent. The back side ILD layer will accordingly provide high thermal conductivity as well as providing other benefits as described above. As indicated above, in general, non-porous SiCNOH ILD material is preferable over non-porous SiCNH ILD material, but both are preferable to pSiCNOH/pSiCNH. As mentioned previously, dense SiCNOH film will improve Cu diffusion/oxidation barrier properties and compressive stress will create less silicon wafer bowing (and subsequent defects) in wafer/devices stacks as compared to pSiCNOH/pSiCNH tensile stress films. It should be noted that all of these compositions can be implemented if the pSiCNO/pSiCN has less than 14% porosity. Overall, pSiCNH/pSiCNOH are superior ILD materials to SiCOH ILD material.

The back side ILD layer 38'' is patterned, thereby again exposing the end surface(s) of via conductor(s) 46-2. It will be appreciated that the "back side" surfaces are at the top of the structure following wafer flip as discussed above. Back side interconnect structure(s) are formed within the patterned back side ILD layer 38''. In some embodiments, the back side interconnect structure(s) include back side power rails incorporated within a back side power delivery network (BSPDN). The via conductor(s) 46-2 is electrically connected to the back side interconnect structure. As illustrated in FIG. 2E, a source/drain contact 44-2 is electrically connected to one of the power rails within a back side interconnect structure 85 by the via conductor 46-2. Other source/drain contacts 44-1 shown in the exemplary structure 80 and gate contacts (not shown) are electrically connected to tracks within the M1 layer. The via conductor 46-2 and the back side power rails may further comprise metal barrier liners (not shown) that adjoin the ILD layer 38''. Exemplary metal barrier liners include Co, CoN, CoW, Mo, Mn, Ni, Ir, Pt, Pd, Ta, TaN, Ti, TiN, Ru, RuN, TaRu, TaNRu, Mn, MnN, W, WN and any combination thereof, as well as any other metal that can serve as a barrier for preventing or reducing the diffusion of conductive metal such as copper from the vias or other metal elements into the surrounding dielectric material. In some embodiments, it may be possible to omit the metal barrier liners through the use of ILD layers having barrier properties.

FIG. 3A, FIG. 3B, FIG. 3C and FIG. 3D provide views of an alternative embodiment of a semiconductor structure. Some elements of the alternative embodiment are designated by reference numerals used previously herein. Such reference numerals designate elements that are the same or similar to elements described above. The exemplary semiconductor structure 200 includes both front side and back side source/drain contacts formed on source/drain regions 22 of field-effect transistors. The front side source/drain contacts 202F (CA) and gate contacts 204 (CB) are electrically connected to a BEOL layer(s) 65. As the semiconductor structure is flipped during fabrication, a carrier wafer 75 is bonded to the BEOL layer(s) prior to wafer flip.

The semiconductor structure 200 includes a device layer 45 formed in FEOL processing. Techniques as described above may be employed to form the field-effect transistors and possibly other electronic devices (not shown) incorporated within the device layer. The device layer includes FETs comprising channel regions (stacked silicon channel layers 21 in the exemplary structure), source/drain regions 22 extending laterally from the channel regions, and gate stacks 26, all of which are embedded within an ILD layer. Dielectric inner spacers 23 are positioned between the silicon channel layers 21. Gate cut regions 216 electrically isolate portions of the gate stacks 26 from each other. Gate cut regions are formed at cell boundaries. Cell boundaries are generally located at "NFET-to-NFET space" and "PFET-to-PFET space" boundaries. Front side source/drain contacts 202F adjoin the top surfaces of selected source/drain regions. The front side source/drain contacts 202F are employed to electrically connect selected source/drain regions to an M1 metal wiring layer (not shown) and the BEOL layer(s). Back side source/drain contacts 202B adjoin the back side surfaces of other selected source/drain regions. The back side source/drain contacts are employed to electrically connect selected source/drain regions 22 with a back side interconnect structure such as a back side power delivery network (BSPDN) 205. The BSPDN may comprise a layer including back side power rails 210. The back side power delivery network 205 and associated power rails 210 (VSS, VDD) obviate the need for M1 power rails. In some embodiments, some FETs in the device layer may have source/drain regions that are electrically connected only to the BEOL interconnect layer by front side contacts.

The layers on the back side of the semiconductor structure may be formed from a structure that is similar to the structure 40 discussed above with respect to FIG. 2A. The etch stop layer and the portion of the silicon substrate layer beneath a bottom dielectric insulation (BDI) layer 212' are selectively removed. The BDI layer protects the metal gate during this stage of the process. Gate spacers 212 can be formed at the same time the BDI layer is formed. A back side ILD (BILD) layer 214 is deposited on the inverted structure and planarized. The back side ILD layer may have the same composition(s) as the back side ILD layer 38" discussed above with respect to FIG. 2E.

The back side ILD layer 214 is patterned, thereby exposing the back surfaces of selected source/drain regions. Back side contact metallization is followed by metal overburden removal to form back side source/drain contacts 202B. The back side source/drain contacts contact the back side (bottom) surfaces of selected source/drain regions. The back side source/drain contacts may or may not comprise the same metal(s)/metal silicide(s) used to form the front side source/drain contacts 202F.

Figures 3A, 3B, 3C, 3D:
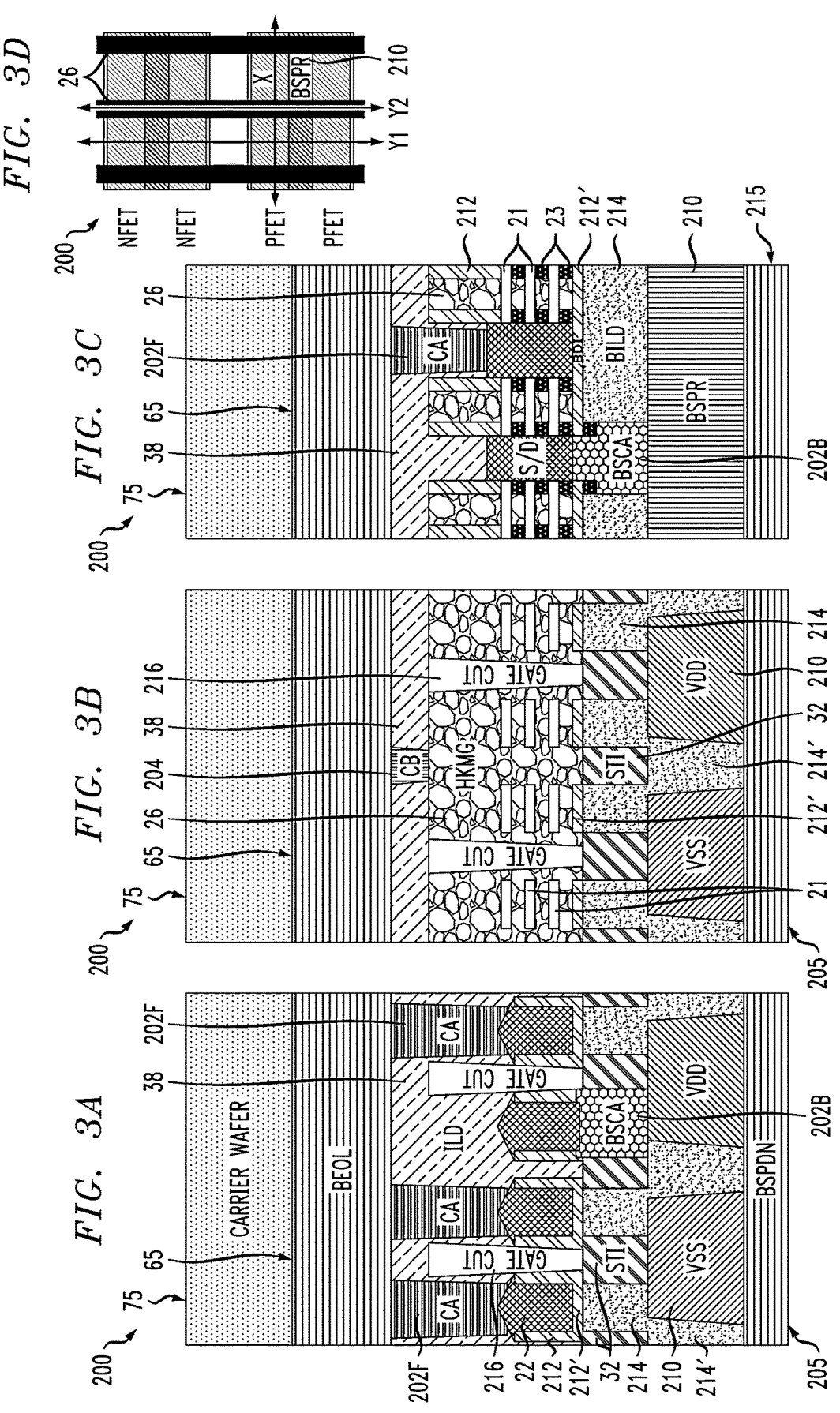
FIG. 3A is a schematic, cross-sectional view showing taken along section line X of FIG. 3D, showing a semiconductor structure including n-type and p-type nanosheet transistors.
FIG. 3B is a schematic, cross-sectional view thereof taken along section line Y1 of FIG. 3D.
FIG. 3C is a schematic, cross-sectional view thereof taken along section line Y2 of FIG. 3D.
FIG. 3D is a top plan view thereof.

A further back side ILD layer 214' is deposited and patterned. The back side power rails 210 are formed on the patterned ILD layer 214'. As shown in FIG. 3A and FIG. 3C, one of the back side power rails contacts a back side source/drain contact 202B. The SiCNOH, pSiCNOH, or SICNH ILD layers 214, 214' have effective copper diffusion barrier properties and thereby provide better tolerance for copper to copper or copper to metal misalignment. They also have better (ILD) oxidation barrier properties than dielectric materials such as SiCOH at thicknesses less than ten nanometers.

Relative bond levels (integrated peak area) of exemplary ILD materials are indicated in FIG. 5A. The materials identified by $N_2O$ flow rates are non-porous SiCNOH fabricated using precursors as discussed above with different $N_2O$ flow rates during PECVD. FIG. 5B shows overall FTIR (Fourier-transform infrared spectroscopy) bonding spectra and bonding structure of SiCNOH, SiCNH vs. pSiCNOH. It can be seen that the pSiCNOH samples have more Si—O bonding (~1000 cm-1 wave number) and much less Si—C/SiN bonding (~800 cm-1 wave number) as compared to other SiCNO and SiCN samples. Stronger tetrahedral bonding Si—C in SiCNH and SiCNOH are preferable to generate a strong bonding network for modulus and Cu diffusion barrier effectiveness for the overall dielectrics. The FTIR data show the bonding impact to modulus strength and Cu Diffusion barrier, thereby showing C-Rich SiCNOH and SiCNH have better modulus/Cu diffusion barrier properties as compared to pSiCNOH.

The low-k, carbon-rich SiCNOH and SiCNH ILD layers as described above can be employed in different fabrication processes to form structures as discussed above or portions of such structures. In one exemplary embodiment, a low-k, carbon-rich ILD layer is deposited and lithographically patterned. A reactive ion etch of the patterned ILD layer is followed by metal deposition and then chemical mechanical planarization (CMP) to remove overburden and expose end portions of the deposited metal. The resulting metallized ILD layer is then bonded to another metallized layer (e.g. copper to copper or copper to metal bonding). Slight misalignment of the bonded metal layers will not result in significant diffusion of copper into the adjoining dielectric material due to the barrier properties of the material comprising the ILD layer.

In an alternative fabrication process, a metal layer or a memory stack layer (including, for example a magnetic tunnel junction) is lithographically patterned to form lines, pillars and/or other features separated by gaps. A carbon-rich ILD layer is deposited on the patterned layer, filling the gaps between the metal or memory stack features. Plasma-enhanced atomic layer deposition, chemical deposition or flowable chemical vapor deposition using precursors as described above causes the gaps to be filled by low-k dielectric material having effective barrier properties. Following planarization, the planarized layer is bonded to a further layer to provide copper to copper or copper to metal bonding. The carbon-rich ILD layer has effective copper and oxidation diffusion barrier properties, high modulus, and low plasma-induced damage (PID). FIG. 6 shows relative levels of plasma induced damage on selected ILD materials resulting from a reactive ion etch using oxygen and a buffered hydrofluoric acid etch. PID of non-porous, carbon-rich SiCNH and SiCNOH dielectric materials is much lower in comparison to low-k SiCOH as well as pSiCNOH. There is also no need for an adhesion layer to be formed on carbon-rich SiCNH and SiCNOH ILD layers in order to effect bonding to most dielectric materials and metal.

The drawing figures as discussed above depict exemplary processing steps/stages in the fabrication of exemplary structures. Although the overall fabrication methods and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having, for example, interconnect structures and back side power delivery networks formed or bonded in accordance with one or more of the exemplary embodiments.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" and "vertical" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b). It is submitted with the understanding that it will not be used to interpret or limit the scope or meaning of the claims. In addition, in the foregoing Detailed Description, various features may be grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A multi-layer semiconductor structure, comprising:
a device layer comprising field-effect transistors and including a front side and a back side;
a first interconnect layer above the front side of the device layer and electrically connected to the device layer;
a back side power distribution network below the back side of the device layer, the back side power distribution network including a top metal interconnect layer, a bottom metal interconnect layer, and bottom vias electrically connecting the top metal interconnect layer and the bottom metal interconnect layer;
a silicon substrate between the back side power distribution network and the device layer;
through silicon vias extending vertically within the silicon substrate, the through silicon vias being electrically connected to the device layer and having bottom ends adjoining the top metal interconnect layer of the back side power distribution network;
a silicon carbonitride and/or silicon oxycarbonitride low-k interlevel dielectric layer beneath the silicon substrate, the low-k interlevel dielectric layer having a composition of greater than fifty atomic percent carbon, less than ten atomic percent nitrogen, and less than ten atomic percent oxygen, the low-k interlevel dielectric layer having a top surface adjoining the silicon substrate, the top metal interconnect layer and the bottom vias being embedded within the low-k interlevel dielectric layer.

2. The multi-layer semiconductor structure of claim 1, further including power rails extending within the silicon substrate, the power rails being electrically connected to the device layer and having bottom ends adjoining the through silicon vias.

3. The multi-layer semiconductor structure of claim 1, wherein the low-k interlevel dielectric layer further comprises a silicon oxycarbonitride layer that comprises 53-59 atomic percentage carbon, 32-33 atomic percentage silicon, 3-4 atomic percentage oxygen, and 6-7 atomic percentage nitrogen.

4. The multi-layer semiconductor structure of claim 1, wherein the low-k interlevel dielectric layer is non-porous and exhibits compressive stress.

5. The multi-layer semiconductor structure of claim 1, wherein the low-k interlevel dielectric layer is porous and has a porosity of fourteen percent or less.

6. The multi-layer semiconductor structure of claim 1, further including:
a metal barrier liner within each via, the metal barrier liner adjoining the electrically conductive material and the low-k interlevel dielectric layer and having a thickness of less than six nanometers.

7. The multi-layer semiconductor structure of claim 1, wherein the low-k interlevel dielectric layer is a monolithic layer having a dielectric constant of 3.3 or less.

8. A multi-layer semiconductor structure, comprising:
a device layer including a front side and a back side, the device layer comprising:
field-effect transistors within a front side interlevel dielectric layer, each of the field-effect transistors including a channel region, a gate stack adjoining the channel region, and first and second source/drain regions extending laterally from the channel region;

a back-end-of-line interconnect layer over the front side of the device layer, the back-end-of-line interconnect layer being electrically connected to the device layer;
a back side power distribution network;
a silicon carbonitride and/or silicon oxycarbonitride low-k back side interlevel dielectric layer between the device layer and the back side power distribution network, the low-k back side interlevel dielectric layer having a composition of greater than fifty atomic percent carbon, less than ten atomic percent nitrogen, and less than ten atomic percent oxygen; and
electrically conductive interconnects embedded within the low-k back side interlevel dielectric layer, the device layer and the back side power distribution network being electrically connected by the electrically conductive interconnects.

9. The multi-layer semiconductor structure of claim 8, further including power rails embedded within the low-k back side interlevel dielectric layer, the electrically conductive interconnects being electrically connected to the power rails.

10. The multi-layer semiconductor structure of claim 8, wherein the low-k back side interlevel dielectric layer further comprises 53-59 atomic percentage carbon, 33-34% atomic percentage silicon, 3-4% atomic percentage oxygen, and 6-7% atomic percentage nitrogen.

11. The multi-layer semiconductor structure of claim 8, wherein the low-k back side interlevel dielectric layer is porous and has a porosity of fourteen percent or less.

12. The multi-layer semiconductor structure of claim 8, wherein the low-k back side interlevel dielectric layer is non-porous and exhibits compressive stress.

13. The multi-layer semiconductor structure of claim 12, further including metal barrier liners adjoining the electrically conductive interconnects and the low-k back side interlevel dielectric layer, the metal barrier liners each having a thickness of less than six nanometers.

14. The multi-layer semiconductor structure of claim 12, further including shallow trench isolation regions adjoining the device layer and extending within the low-k back side interlevel dielectric layer.

15. The multi-layer semiconductor structure of claim 12, wherein the low-k back side interlevel dielectric layer comprises silicon oxycarbonitride.

16. The multi-layer semiconductor structure of claim 15, wherein the silicon oxycarbonitride comprises at least fifty-three atomic percent carbon.

17. A method of fabricating a multi-layer semiconductor structure, comprising:
forming a device layer including field-effect transistors;
forming one or more front side metal interconnect layers over a front side of the device layer; and
forming a back side interconnect layer over a back side of the device layer, the back side interconnect layer including a low-k interlevel dielectric layer and metal conductors embedded within the low-k interlevel dielectric layer, the low-k interlevel dielectric layer comprising silicon carbonitride and/or silicon oxycarbonitride having a composition of greater than fifty atomic percent carbon, less than ten atomic percent nitrogen, and less than ten atomic percent oxygen.

18. The method of claim 17, wherein the low-k interlevel dielectric layer exhibits compressive strain and comprises silicon oxycarbonitride having 53-59 atomic percentage carbon, 32-33 atomic percentage silicon, 3-4 atomic percentage oxygen, and 6-7 atomic percentage nitrogen.

19. The method of claim 17, wherein the low-k interlevel dielectric layer comprises non-porous silicon oxycarbonitride.

20. The method of claim 17, wherein the low-k interlevel dielectric layer is porous and has a porosity of fourteen percent or less.

*  *  *  *  *